United States Patent [19]

Dennison

[11] Patent Number: 5,250,457
[45] Date of Patent: Oct. 5, 1993

[54] METHOD OF FORMING A BURIED BIT LINE ARRAY OF MEMORY CELLS

[75] Inventor: Charles Dennison, Boise, Id.
[73] Assignee: Micron Technology, Inc., Boise, Id.
[21] Appl. No.: 838,549
[22] Filed: Feb. 19, 1992
[51] Int. Cl.$^5$ .................. H01L 21/70; H01L 27/00
[52] U.S. Cl. .................. 437/48; 437/50; 437/52
[58] Field of Search ............... 437/47, 52, 60, 919, 437/225, 192–200; 156/643, 657; 257/296–313; 365/149, 185

[56] References Cited

U.S. PATENT DOCUMENTS

| | | | |
|---|---|---|---|
| 4,987,099 | 1/1991 | Flanner | 437/192 |
| 5,023,683 | 6/1991 | Yanada | 257/309 |
| 5,032,882 | 7/1991 | Okumura et al. | 257/302 |
| 5,084,414 | 1/1992 | Manley et al. | 437/192 |
| 5,087,591 | 2/1992 | Teng | 156/643 |
| 5,120,679 | 6/1992 | Boardman et al. | 437/192 |

FOREIGN PATENT DOCUMENTS 2-275665  11/1990  Japan ................ 437/52

OTHER PUBLICATIONS

Kawamoto, et al., "A 1.28 μm$^2$ Bit-Line Shielded Memory Cell Technology for 64 Mb DRAMs," Symposium on VLSI Tech., 1990 IEEE, pp. 13–14.

Primary Examiner—Olik Chaudhuri
Assistant Examiner—H. Jey Tsai
Attorney, Agent, or Firm—Wells, St. John, Roberts, Gregory & Matkin

[57] ABSTRACT

A method of forming a buried bit line array of memory cells comprises: a) providing an array of word lines atop a semiconductor wafer; b) providing active areas about the word lines to define an array of memory cell FETs, the active areas being defined by a first active region for electrical connection with a memory cell capacitor and a second active region for electrical connection with a bit line; c) providing a layer of first material (preferably polyimide) atop the wafer to a selected thickness; d) patterning and etching the layer of first material to define a pattern of buried bit line grooves for formation of buried bit lines therewithin, the bit line grooves having a first selected width; e) providing a layer of insulating material to a selected thickness atop the wafer over the patterned and etched layer of first material, the selected thickness of insulating material being less than half the first selected width, the layer of insulating material narrowing the bit line grooves to a smaller second width; f) providing bit line contact openings to second active regions within and at the bases of the second width bit line grooves; g) conductively doped polysilicon and on overlying higher conductive material are provided within the grooves for bit line formation; h) an array of capacitors are provided atop the wafer which electrically engage with first active regions.

40 Claims, 9 Drawing Sheets

METHOD OF FORMING A BURIED BIT LINE ARRAY OF MEMORY CELLS

TECHNICAL FIELD

This invention relates generally to methods of forming buried bit line arrays of memory cells.

BACKGROUND OF THE INVENTION

Conventional stacked capacitor DRAM memory arrays utilize either a buried bit line or a non-buried bit line construction. With buried bit line constructions, bit lines are provided in close proximity to the bit line contacts of the memory cell FETs, with the cell capacitors being formed horizontally over the top of the word lines and bit lines. With non-buried bit line constructions, deep vertical contacts are made through a thick insulating layer to the cell FETs, with the capacitor constructions being provided over the word lines and beneath the bit lines. This disclosure concerns fabrication of memory arrays having buried bit lines.

There is a continuing goal in semiconductor wafer processing to shrink the memory cell size thereby maximizing density. At this writing, the industry is striving to develop a generation of 64 megabyte DRAMs of a conventional chip size. One concern in DRAM processing is the pitch or separation distance between adjacent bit lines and adjacent word lines. For example with respect to bit lines, the bit lines at various points must contact one of the active areas of each cell FET. Such are commonly referred to as bit line contacts. An insulating layer is provided atop the wafer for isolation of the various active regions. Thereafter, bit line contacts are opened to the desired active areas using photolithography techniques. At some point thereafter, bit line material is deposited atop the wafer and patterned to define a desired array of bit lines.

However, a safety factor must be provided for mask misalignment to assure that the bit lines completely overlap the bit contact. This is typically accomplished by enlarging the bit line areas around where the contact etch has occurred to allow for mask misalignment in ensuring adequate contact of the bit lines relative to the bit line contacts.

Figure 1:
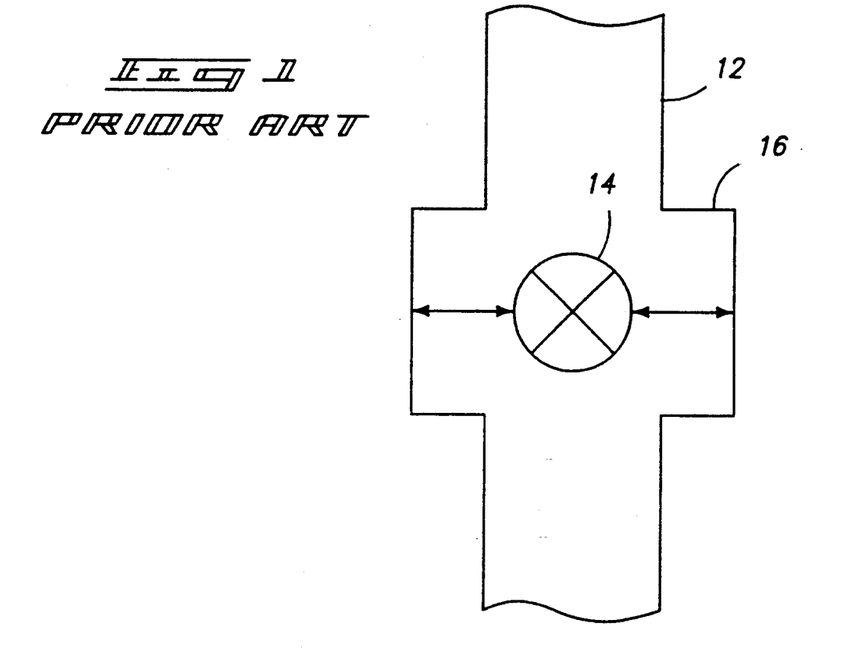
FIG. 1 is a top plan view of a prior art bit line and bit line contact on a semiconductor wafer, and is discussed in the "Background" section above.

Such is illustrated in FIG. 1, where a bit line 12 and a bit line contact 14 are illustrated. Where bit line 12 overlies contact 14, an enlarged bit line area 16 referred to as "surround" is provided. This ensures adequate engagement of contact 14 with bit line 12 due to inadvertent mask misalignment of the patterning of bit lines 12 relative to contacts 14. This technique does however have the drawback of an overall widening of the bit lines requiring that bit lines be spaced farther apart from one another than were such surround not present.

Figure 2:
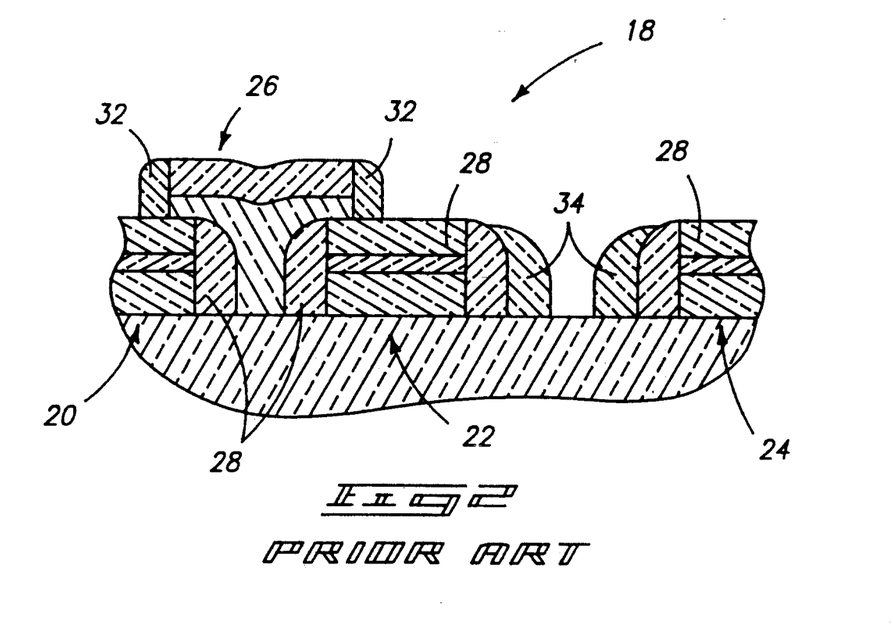
FIG. 2 is a cross sectional view of a wafer fragment processed in accordance with prior art techniques, and is discussed in the "Background" section above.

With respect to word lines, a problem which works against cell density maximization for buried bit line DRAMs is illustrated in FIG. 2. There illustrated is a wafer fragment 18 having a series of word lines 20, 22 and 24. Also illustrated is a bit line 26. The illustrated cross section has been taken on a diagonal cut through the array, whereby the bit line 26 in FIG. 2 does not appear to run perpendicularly relative to the word lines. In typical prior art fabrication, the word lines are formed first with their associated spacers, such as the illustrated spacers 28. Sometime thereafter, bit line material is applied atop the wafer and etched to define the respective bit lines 26. Insulating spacers must also be provided about the bit lines 26 for electrical isolation purposes. The bit line spacers are designated with numeral 32. During formation of spacers 32, unfortunately additional spacers 34 are added about the already insulated and spaced word lines. Thus, double spacers are formed about the word lines. This requires that the word lines be spaced farther apart than is otherwise desired to provide ample room between word lines for making desired contacts to active areas for the future storage capacitor. Such increase in word line pitch works against density maximization.

Another problem associated with buried bit line formation is the etch which produces the bit line pattern. The bit lines to be formed serpentine up and down perpendicularly over the word lines, thereby having a widely varying topography across the wafer. Etching of layers having widely varying topography requires a significant amount of over etch and is vulnerable to leaving resistive shorts between the bit lines.

It would be desired to overcome these and other aspects of the prior art in forming buried bit line arrays of memory cells.

BRIEF DESCRIPTION OF THE DRAWINGS

Preferred embodiments of the invention are described below with reference to the following accompanying drawings.

FIG. 3 is a cross sectional view of a semiconductor wafer at one processing step in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with an aspect of the invention, a method of forming a buried bit line array of memory cell comprises:

providing an array of substantially electrically isolated conductive word lines atop a semiconductor wafer, the conductive portions of adjacent word lines being separated from one another by a selected separation distance;

providing active areas about the word lines to define an array of memory cell FETs, the active areas being defined by a first active region for electrical connection with a memory cell capacitor and a second active region for electrical connection with a bit line;

providing a layer of first material atop the wafer to a selected thickness;

patterning and etching the layer of first material to define a pattern of buried bit line grooves for formation of buried bit lines therewithin;

providing bit line contact openings to second active regions within the bit line grooves;

providing a layer of conductively doped polysilicon atop the wafer to a selected thickness sufficient to plug the bases of the bit line grooves and electrically engage second active regions therewithin;

providing a conductive material having higher conductivity than conductively doped polysilicon within the bit line grooves atop the polysilicon within the bit line grooves;

providing an insulating material above the conductive material; and providing an array of capacitors atop the wafer which electrically engage with first active regions.

Preferably, the first material comprises polyimide. Also preferably, the first material is patterned to define a first series of bit line grooves having a first selected width. Next, a layer of insulating material is provided atop the wafer to a selected thickness over the patterned and etched layer of first material. The selected thickness of insulating material is less than half the first selected width, and effectively narrows the bit line grooves to a smaller second width. After opening bit line contacts through the insulating material, conductively doped polysilicon is applied atop the wafer and the process continued as described above. Such has the effect of electrically isolating the sides and tops of the bit lines in conjunction with the formation of the bit line grooves which define the desired bit line pattern.

Referring more particularly to the figures, FIG. 3 illustrates a semiconductor wafer fragment indicated generally by reference numeral 35. Wafer 35 has been provided with an array of substantially electrically isolated word lines, such as the illustrated word lines 36, 38 and 40. Such word lines have conventional lowermost gate oxide, a polysilicon layer, an overlying silicide layer such as tungsten silicide, an oxide cap, and side oxide spacers. The side oxide spacers are designated with numeral 44 and the oxide caps with numeral 45, with the other features of word lines 36, 38 and 40 not being designated with numerals for clarity in the drawings.

The conductive portions of adjacent word lines are separated from one another by a selected separation distance "F". In accordance with an aspect of the invention, separation distance "F" can be the selected minimum photo feature width utilized in the photomasking process resulting in a word line pitch of $2 \times F$, where pitch refers to the line and space used in the memory array, thus increasing circuit density. Note that with respect to the prior art of FIG. 2, word line separation distance at the first storage node side is approximately equal to 1.5-2.0 F to account for the added spacer 34.

Active areas are provided about the word lines to define an array of memory cell FETs, such as active regions 46, 48 shown about word line 38. The discussion proceeds with reference to transistor gate/word line 38 which will be provided with a capacitor construction for definition of a single memory cell. Active region 48 defines a first active region for electrical connection with the memory cell capacitor (described below) and active region 46 defines a second active region for electrical connection with a bit line (described below).

A protective barrier layer 50 is provided atop wafer 35 of a selected thickness of from about 100 Angstroms to about 1000 Angstroms, with about 500 Angstroms being most preferred. Layer 50 is preferably comprised of an insulating material, such as $SiO_x$ depositied by CVD of TEOS or of a nitride material. The function of layer 50 is more fully described below.

Figure 4:
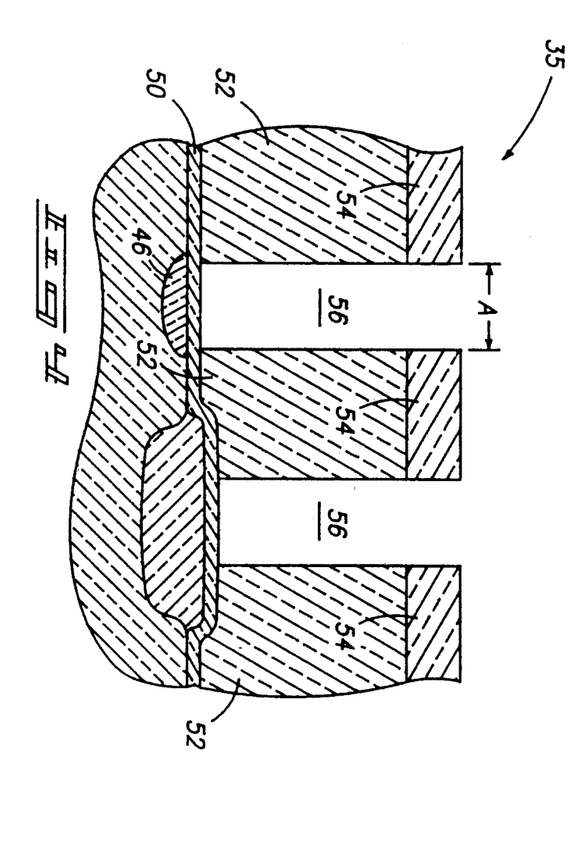
FIG. 4 is a cross sectional view of the FIG. 3 wafer taken at 90° relative to FIG. 3 and at a processing step subsequent to FIG. 3, and along section line 4—4 in FIG. 5.

Referring to FIG. 4, a layer 52 of a first material is applied atop the wafer to a selected thickness over layer 50. The first material should be selectively etchable relative to oxide and polysilicon. Preferably, polysilicon and oxide should be selectively etchable relative to the first material. The first material as well preferably provides a substantially planer upper surface. The material of choice is polyimide which is spun onto wafer 35. The preferred thickness for layer 52 is from about 3000 Angstroms to about 12,000 Angstroms above the upper surface of oxide cap 45 (not viewable in the FIG. 4 cross section) with about 5000 Angstroms being most preferred. Where polyimide is used, oxide layer 50 functions as a protection/barrier layer to prevent any attack or migration of polyimide from layer 50 into the substrate by the various subsequent processing steps.

Figure 5:
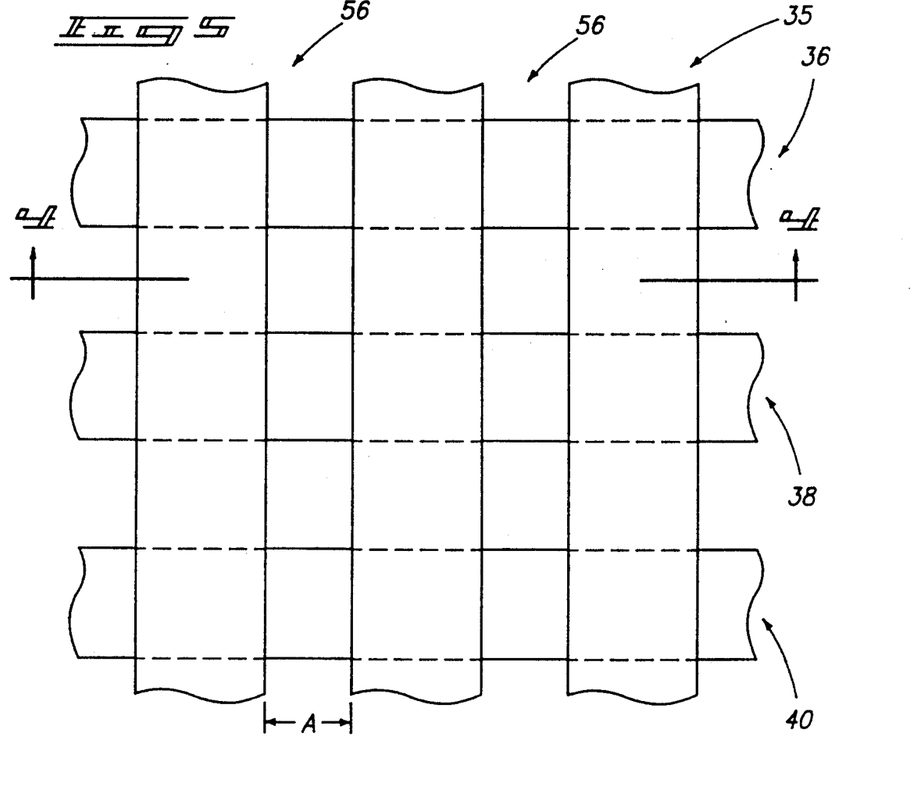
FIG. 5 is a top plan view of the FIG. 3 wafer illustrated at the same processing step depicted by FIG. 4. In the remainder of the figures, the sectional views are somewhat reduced in size from the top or plan views.

A nitride layer 54 is provided atop polyimide layer 52 to a thickness of from about 200 Angstroms to about 3000 Angstroms, with about 1500 being most preferred. Nitride layer 54 is optionally provided to produce a protective hard mask atop polyimide layer 52. Such a mask assists in later etch steps in preventing undesired removal of polyimide at such steps in the process. FIG. 4 illustrates layers 52 and 54 having been patterned and etched to define a pattern of buried bit line grooves 56 for formation of buried bit lines therewithin. Bit line grooves 56 have a first selected width "A". For a 64 megabyte construction, "A" is expected to equal about 4000 Angstroms to about 7000 Angstroms. FIG. 5 is a top plan view of wafer 35 corresponding in processing sequence with that of FIG. 4. The etch for initially providing bit line grooves 56 can be conducted by known reactive ion etching techniques. Polyimide can be reactive ion etched in the presence of $O_2$ which will not etch layer 50.

Immediately after the photo resist patterns, an isotropic $O_2$ plasma etch can be utilized to widen bit line grooves 56 beyond the lithographic capability of the lithographic exposure tool, if desired. An example technique would be an isotropic oxygen plasma descum etch. Note also that the grooves of the periphery and the array are preferably of the same width.

Figure 6:
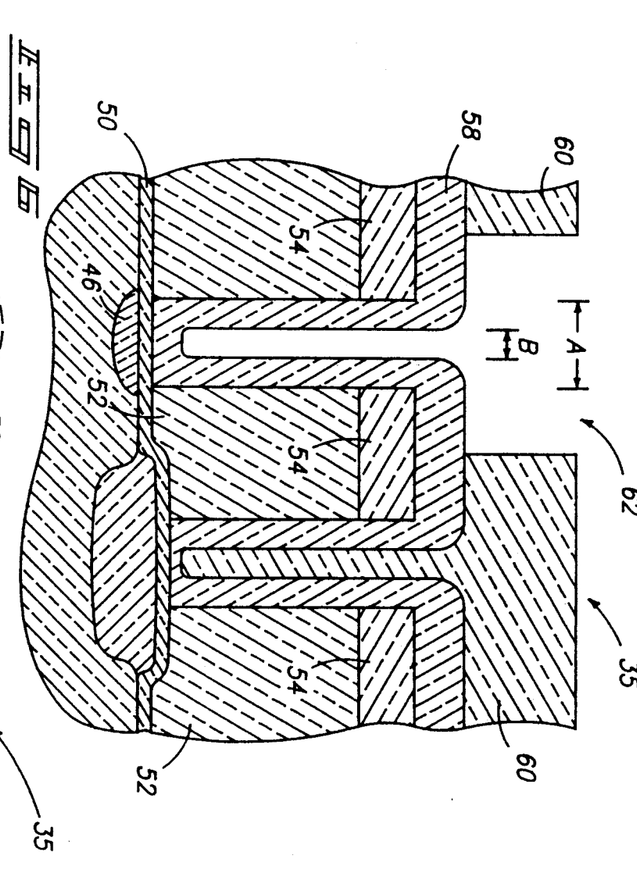
FIG. 6 is a cross section of the FIG. 3 wafer corresponding in position to FIG. 4, and taken through line 6—6 in FIG. 7. Such illustrates the FIG. 3 wafer at a processing step subsequent to that shown by FIGS. 4 and 5.
Figure 7:
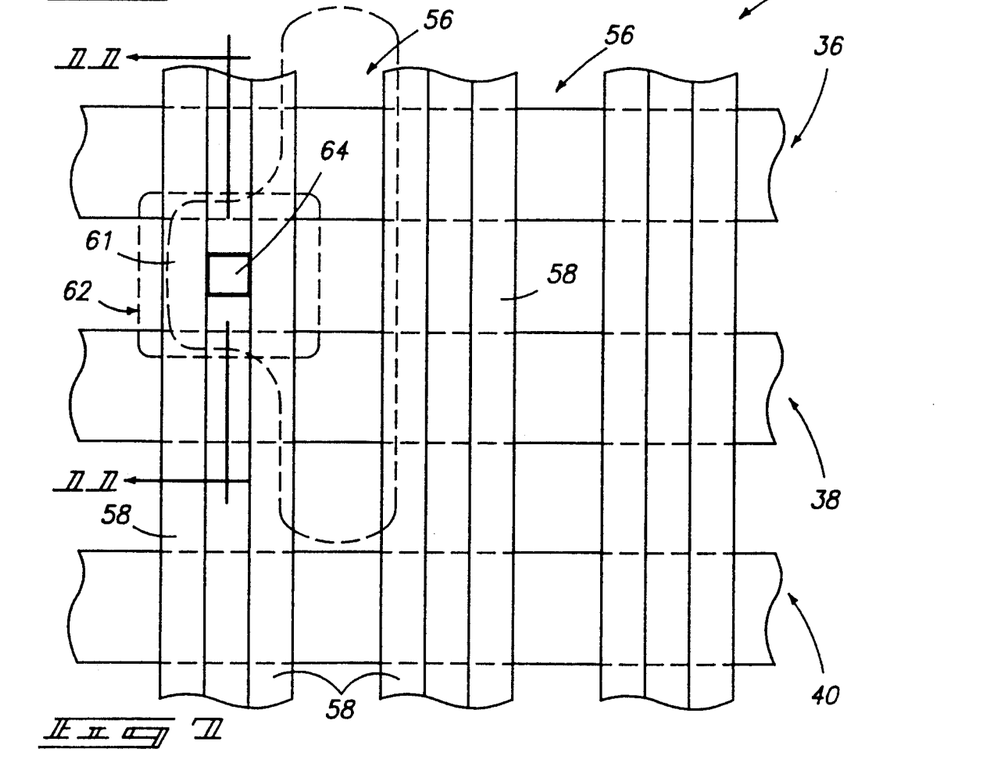
FIG. 7 is a top plan view of the FIG. 3 wafer illustrated at a processing step corresponding to that of FIG. 6.

Referring to FIGS. 6 and 7, a layer 58 of insulating material, preferably $SiO_2$, is provided to a selected thickness over patterned and etched layers 52 and 54. The selected thickness of layer 58 is less than half first selected width "A", preferably being from about 1000 Angstroms to about 3000 Angstroms, with about 1500 Angstroms being most preferred. Insulating layer 58 narrows bit line grooves 56 to a smaller second width "B" and will provide sidewall isolation between the bit lines and future storage capacitors. Note that during such deposition, polyimide has been filled and remains between adjacent word lines over first active regions 48 (future storage capacitor contact location) during deposition of oxide, and thereby prevents word line spacer buildup during such deposition.

Referring further to FIGS. 6 and 7, a photoresist layer 60 is applied, exposed and stripped as indicated to define a first pattern of bit line second active region contacts 62 which overlap beyond bit line grooves 56 both parallel to the word lines and bit lines. A single bit line second active region contact 62 of the first pattern is illustrated in FIG. 7 for clarity in the drawings, although such would be provided across the wafer for each future bit line contact. FIG. 7 also illustrates a single broad outline 61 of active area patterning which is repeated across the array.

Figure 8:
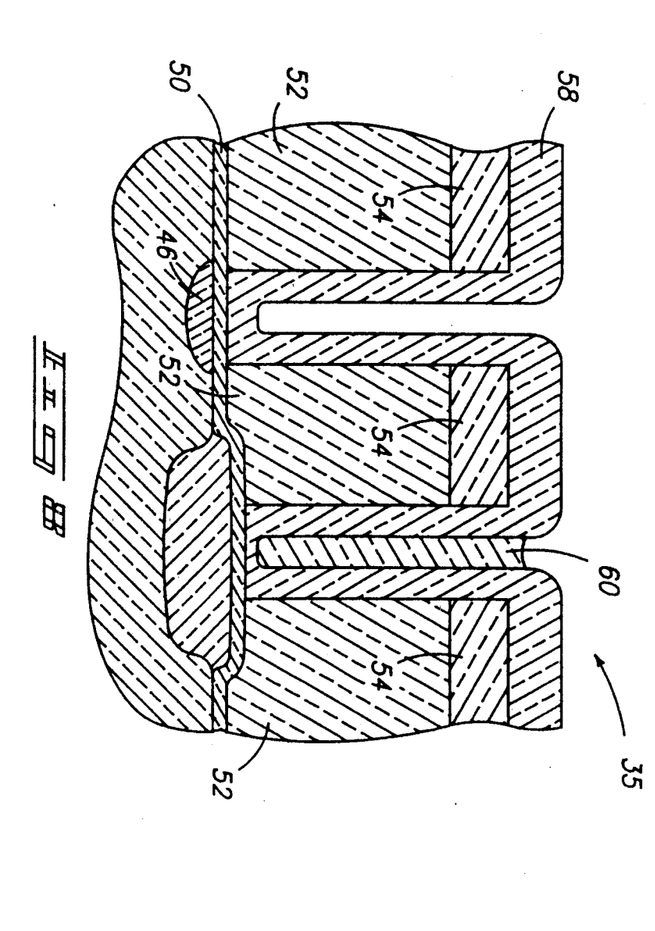
FIG. 8 is a cross sectional view of the FIG. 3 wafer corresponding in position to that of FIG. 4 and shown at a processing step subsequent to that shown by FIGS. 5 and 6.

Referring to FIG. 8, photoresist layer 60 is RIE plasma etched back to remove all of the resist on the top surface of oxide layer 58 leaving resist 60 only in those portions of the bit line grooves where no buried contacts are provided.

Figure 9:
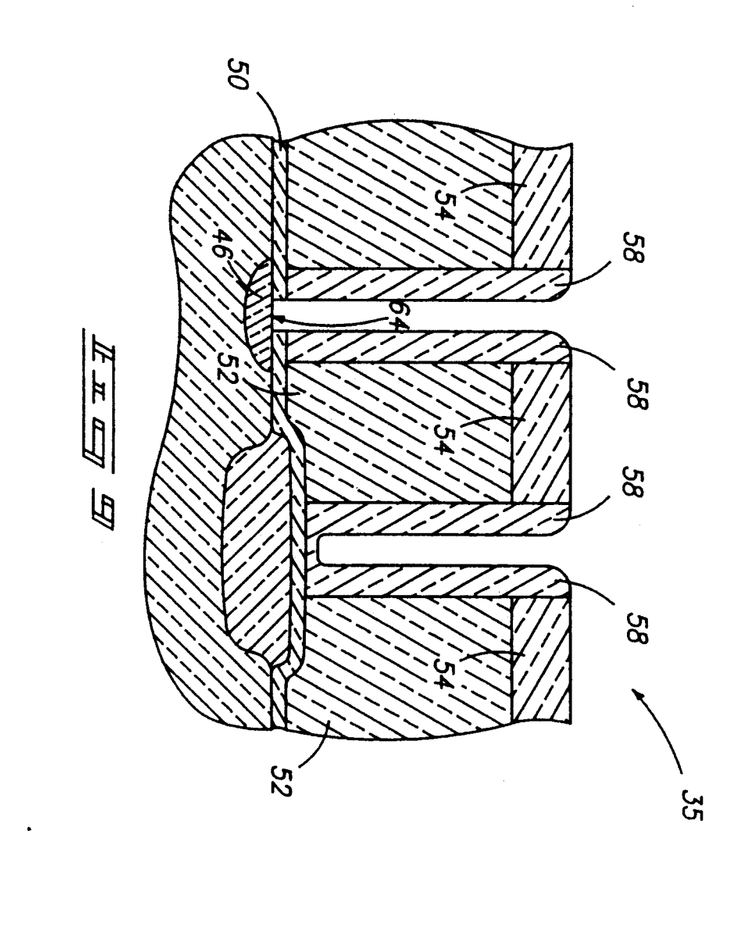
FIG. 9 is a cross sectional view of the FIG. 3 wafer corresponding in position to that of FIG. 4, and shown at a processing step subsequent to that shown by FIG. 8.

Referring to FIG. 9, an oxide etch is then conducted to etch insulating material from the bases of second width bit line grooves 56 to upwardly expose second active regions 46. Such thereby defines a second pattern of bit line second active region contacts 64 (see FIG. 7 for top plan view) which are within the first pattern contact outlines 62. Boundaries of contacts 64 are defined by bit line groove 56 (width "B") sidewalls and by the word line spacers of adjacent word lines. Note that the first pattern of bit line contacts 62 is larger than the second pattern of bit line contacts 64 (FIG. 7). Such a technique provides an advantage of making smaller bit line contact 64 which can have a dimension significantly smaller than the minimum photo feature size without additional photomaking (even if such were possible) beyond the patterning to define contact outline 62.

Thereafter, the resist is stripped from the wafer. Note also that the oxide material atop nitride layer 54 is also preferably completely removed at this portion of the process by an etch which is selective to nitride.

Figure 10:
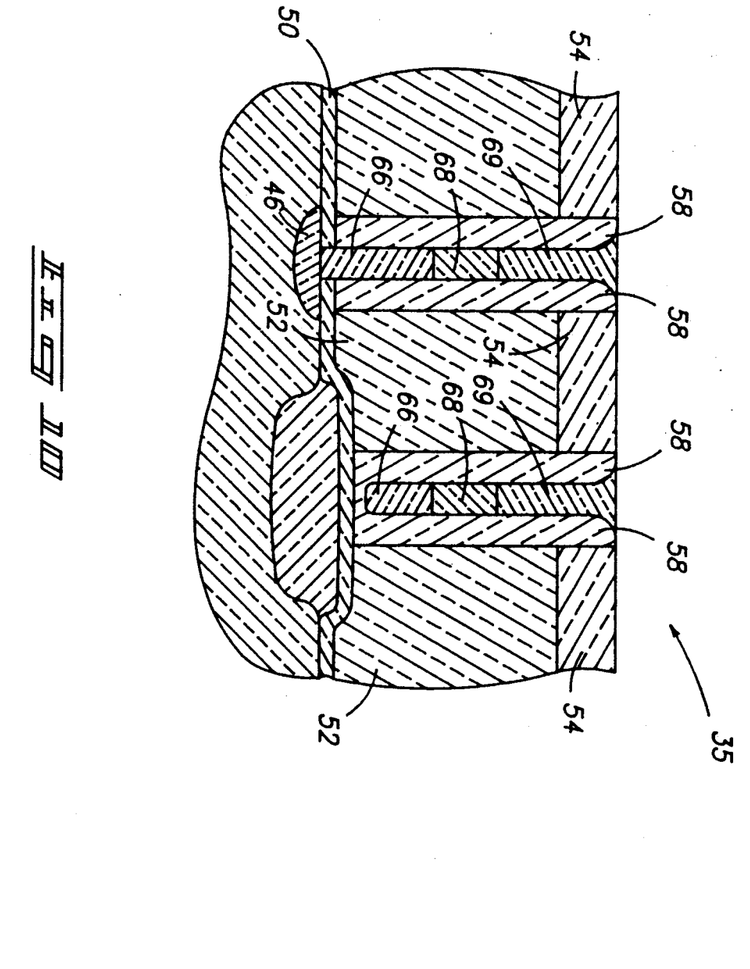
FIG. 10 is a cross sectional view of the FIG. 3 wafer corresponding in position to FIG. 4, and shown at a processing step subsequent to that shown by FIG. 9.
Figure 11:
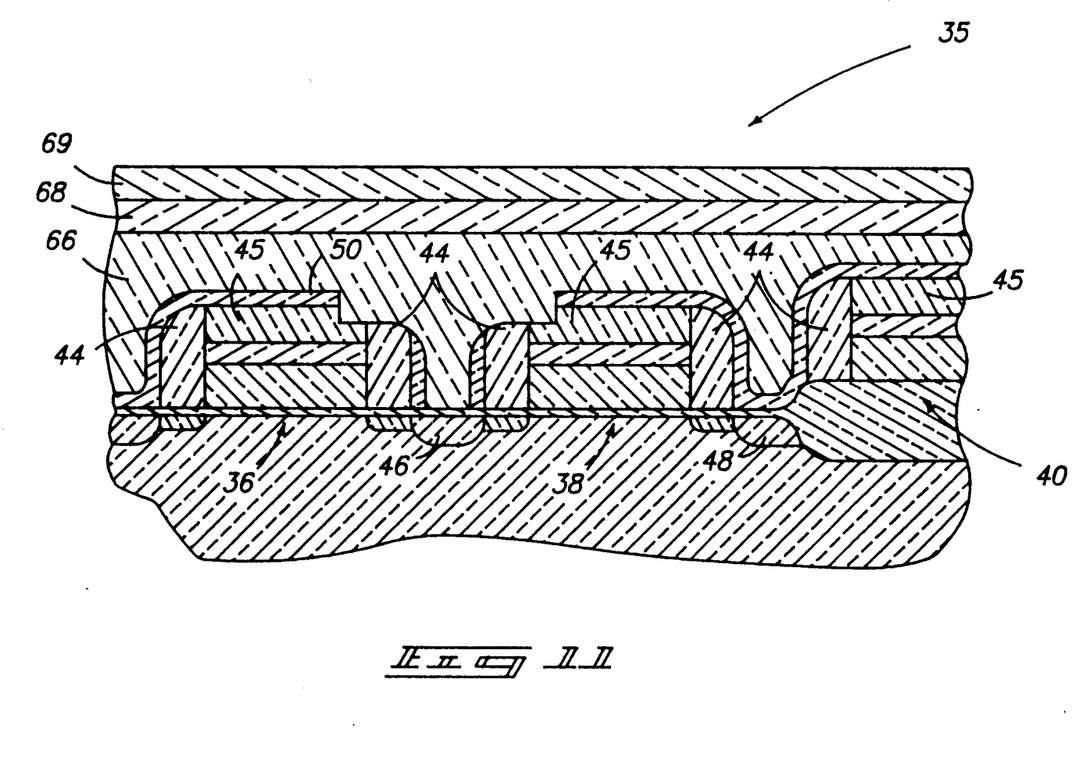
FIG. 11 is a cross sectional view of the FIG. 3 wafer positionally taken through line 11—11 in FIG. 7, but illustrating such wafer at the processing step of FIG. 10.

Referring to FIGS. 10 and 11, a layer 66 of conductively doped polysilicon is provided atop the wafer to a selected thickness sufficient to plug the bases of second width bit line grooves 56 and electrically engage second active regions 46 therewithin. The preferred thickness for polysilicon layer 66 is from about 2000 Angstroms to about 6000 Angstroms with about 4000 Angstroms being most preferred. Thereafter, a blanket polysilicon etch back is conducted leaving preferably about 1000 Angstroms of polysilicon atop the word lines and filling the gap between word lines with polysilicon, making the polysilicon thicker at these locations (see FIG. 11).

Thereafter, a conductive material having higher conductivity than conductively doped polysilicon is provided atop polysilicon layer 66, such as layer 68. An example preferred material is a silicide, such a $WSi_x$. Such can be provided either by metal deposition following by silicidation and subsequent wet etch, or thick CVD silicide or refractory metal deposition (e.g. $WSi_x$ or W) and blanket etch back leaving $WSi_x$ or W on the poly bit line. Thereafter, insulating material, such as oxide 69, is provided atop the silicide to within the grooves, and the wafer again completely planarized preferably by a CMP process. Such processing minimizes the distance of silicide within the array (see FIG. 11), as opposed to silicide on the bit line serpentining up and down between word lines. This reduces the bit line resistance.

Thereafter, an array of capacitors is provided atop the wafer which electrically engage with first active regions 48 (FIG. 3). One technique for doing so would be to first completely strip nitride layer 54 and polyimide layer 52 from the wafer, then photo etch the storage node contact and proceed to deposit storage node poly, followed by a photo etch, followed by a dielectric deposition, followed by cell poly deposition, etc. Such a technique, however, is not the most preferred as it requires storage poly to be etched out of deep trenches between bit lines, and requires a separate photo/etch step for the storage node contact and storage node poly definition.

Figure 12:
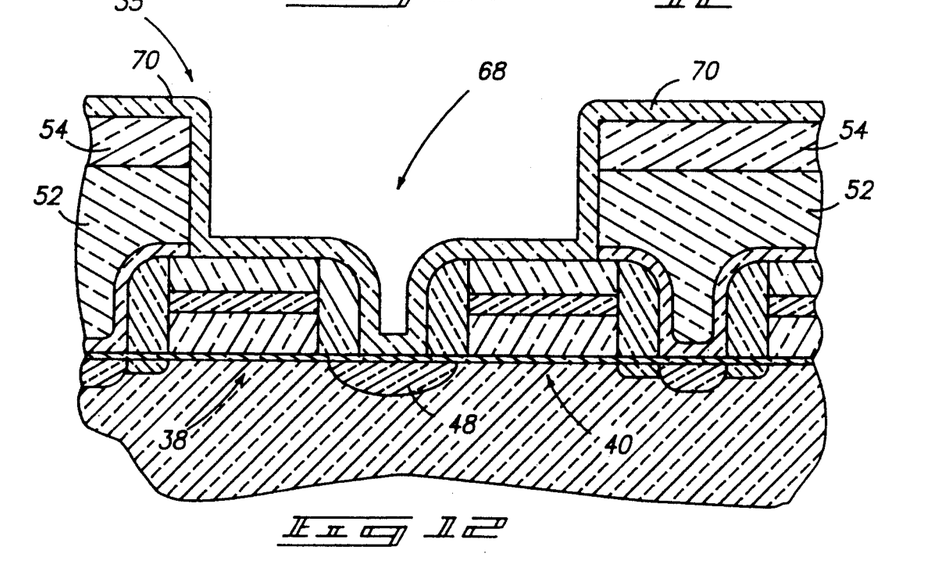
FIG. 12 is a cross sectional view of the FIG. 3 wafer shown at a processing step subsequent to that shown by FIG. 11, and is taken through line 12—12 in FIG. 13.
Figure 13:
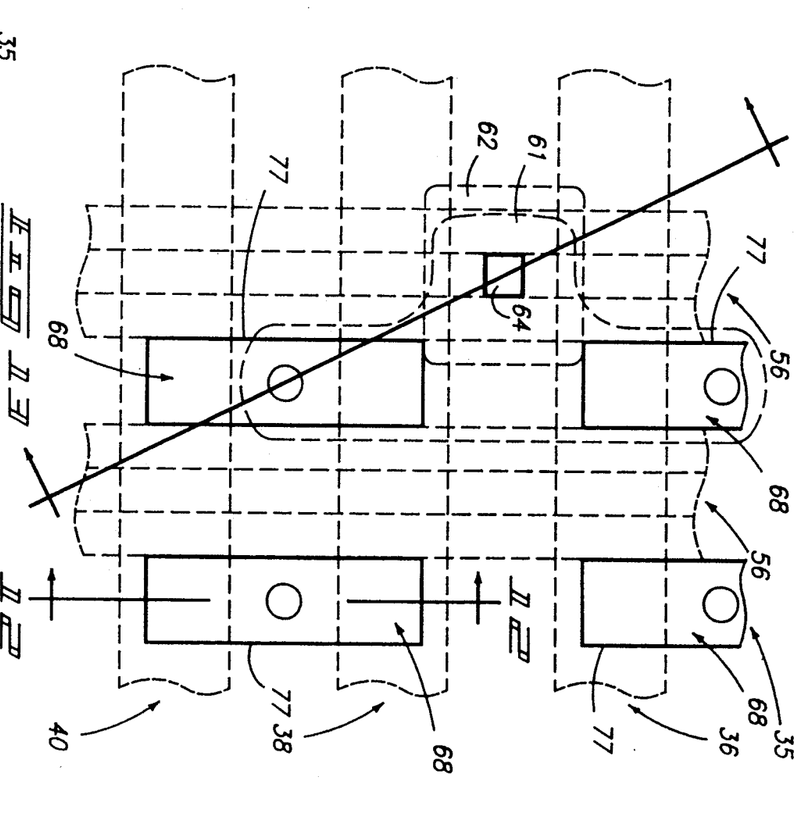
FIG. 13 is a top plan view of the FIG. 3 wafer taken at the processing step corresponding to that shown by FIG. 12. Note that this figure also positionally indicates by the section line the cross sectional cut location of the wafer where FIGS. 3, 11 and 12 have been taken.

A more preferred technique of providing the capacitors is as described in a patent application which was co-pending and simultaneously filed with the application from which this patent matured. That co-pending application is entitled "Method of Forming a Bit Line Over Capacitor Array of Memory Cells", of the same named inventor, which is hereby incorporated by reference. Such a technique is described with reference to FIGS. 12-15. Referring to FIGS. 12 and 13, nitride layer 54, polyimide layer 52, and layer 50 are second patterned and etched, to define buried contact openings 68 to second active regions 48. Preferably, only a minimal amount of oxide layers 69 and 58 are etched because etch chemistry used to etch layer 54 and 52 is chosen to have selectivity to oxide. A sufficient thickness of 69 and 58 is maintained to insure bit lines 66 are fully isolated from storage cap (70). Note that during such etch, the active area on the bit line contact of the word line is not opened up. During such etch, the nitride is first etched selectively relative to oxide to avoid etching the oxide on top of the bit line. Thereafter, an RIE $O_2$ plasma etch is conducted to remove all exposed polyimide, followed by an oxide etch (of layer 50) to expose active regions 48.

Thereafter, a layer 70 of conductively doped polysilicon is provided to a selected thickness atop the wafer over the second patterned layer of polyimide and within buried contacts 68. Layer 70 preferably has a thickness of approximately 1000 Angstroms, and can be optionally texturized to further maximize surface area and correspondingly resultant capacitance.

Figure 14:
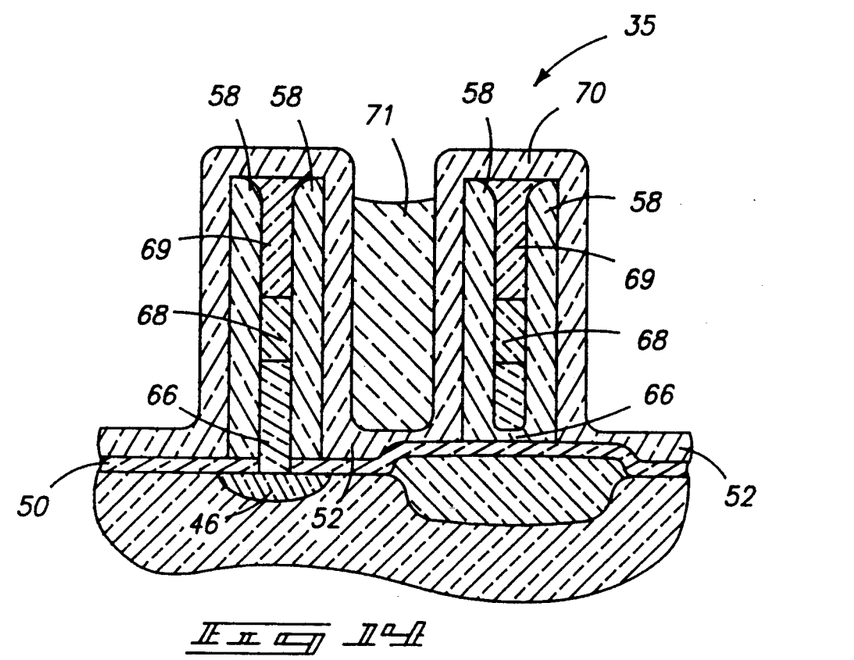
FIG. 14 is a cross sectional view of the FIG. 3 wafer shown at a processing step subsequent to that shown by FIGS. 12 and 13, and corresponds in position to the FIG. 10 view.
Figure 15:
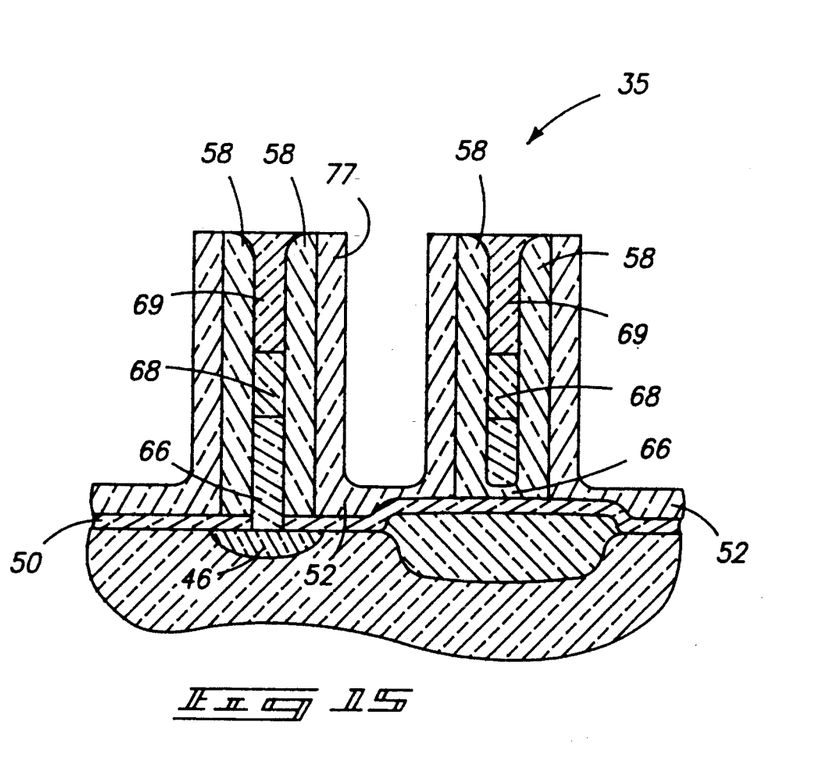
FIG. 15 is a cross sectional view the FIG. 3 wafer shown at a processing step subsequent to that shown by FIG. 14, and corresponding in sectional position to the FIG. 14 view.

Referring to FIG. 14, a photoresist layer 71 can be applied atop the wafer, and an oxygen plasma etch back conducted to expose poly outside of the groove, and leave resist 71 within the groove. Referring to FIGS. 13 and 15, an RIE polysilicon etch is conducted to define isolated cell storage nodes 77 which contact the first active regions. Alternately, a CMP technique can be utilized to define cell storage nodes 77 without the RIE resist etch back. Note that such a technique provides the advantage of producing nodes 77 without any prior patterning of polysilicon layer 70. Remaining nitride from layer 54 is removed by a nitride etch, followed by removal of remaining polyimide layer 52 by an $O_2$ plasma etch. Any resist is then stripped from the wafer.

Thereafter, a capacitor cell dielectric layer is provided atop the individual storage nodes. Then, a capacitor cell polysilicon layer is provided atop the capacitor cell dielectric layer to define an array of memory cell capacitors.

There are numerous advantages to the above described techniques. Such eliminate the need for bit line surround about the bit line contacts. No double spacer build-up about the word lines is generated, resulting in tighter packed word lines. Also, storage node patterning and bit line pattering are eliminated. Further, the two most difficult topology photo steps in a buried bit line flow are now done with the wafer completely flat. Overall stack height can be reduced by not having to have as thick an insulator under the bit line or storage poly to withstand the long etching times associated with the standard process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a buried bit line array of memory cells comprising:

providing an array of substantially electrically isolated conductive word lines atop a semiconductor wafer, the conductive portions of adjacent word lines being separated from one another by a selected separation distance;

providing active areas adjacent to the word lines to define an array of memory cell FETs, the active areas being defined by a first active region for electrical connection with a memory cell capacitor and a second active region for electrical connection with a bit line;

providing a layer of polyimide atop the wafer to a selected thickness, the layer of polyimide having a substantially planar upper surface;

patterning and etching the layer of polyimide to define a pattern of buried bit line grooves for formation of buried bit lines therewithin, the bit line grooves having a first selected width;

providing a layer of insulating material to a selected thickness atop the wafer over the patterned and etched layer of polyimide, the selected thickness being less than half the first selected width, the layer of insulating material narrowing the bit line grooves to a smaller second width, the smaller second width bit line grooves having a base;

applying, exposing and stripping photoresist to define a first pattern of bit line second active region contacts which overlap with bit line grooves;

etching the insulating material from the bases of the second width bit line grooves to upwardly expose second active regions and thereby define a second pattern of bit line second active region contacts within the first pattern;

providing a layer of conductively doped polysilicon atop the wafer to a selected thickness sufficient to plug the bases of the second width bit line grooves and electrically engage second active regions therewithin to at least partially form bit lines;

providing a conductive material having higher conductivity than the conductively doped polysilicon within the second width bit line grooves atop the polysilicon within the second width bit line grooves;

providing an insulating material above the conductive material; and providing an array of capacitors above the bit lines, the capacitors electrically engaging the first active regions.

2. The method of forming a buried bit line array of memory cells of claim 1 wherein the step of providing the insulating material over the patterned and etched layer of polyimide is conducted by depositing an oxide, the layer of polyimide filling between adjacent word lines over the first active regions during such deposition and thereby preventing word line spacer build up during such deposition.

3. The method of forming a buried bit line array of memory cells of claim 1 further comprising processing the wafer using a selected minimum photo feature width, the word line separation distance being equal to the minimum photo feature width.

4. The method of forming a buried bit line array of memory cells of claim 1 further comprising processing the wafer using a selected minimum photo feature width, the word line separation distance being equal to the minimum photo feature width; and wherein, the step of providing the insulating material over the patterned and etched layer of polyimide is conducted by depositing an oxide, the layer of polyimide filling between adjacent word lines over the first active regions during such deposition and thereby preventing word line spacer build up during such deposition.

5. The method of forming a buried bit line array of memory cells of claim 1 wherein the selected thickness of the layer of polyimide is from about 3,000 Angstroms to about 12,000 Angstroms.

6. The method of forming a buried bit line array of memory cells of claim 1 wherein the selected thickness of the layer of insulating material is from about 1,000 Angstroms to about 3,000 Angstroms.

7. The method of forming a buried bit line array of memory cells of claim 1 wherein the first pattern of bit line contacts is larger than the second pattern of bit line contacts, the etching of the insulating material to expose the second active regions and define the second pattern being conducted without additional photomasking.

8. The method of forming a buried bit line array of memory cells of claim 1 further comprising depositing a layer of nitride to a selected thickness atop the polyimide layer, and patterning and etching the nitride and polyimide layers to define the pattern of buried bit line grooves.

9. The method of forming a buried bit line array of memory cells of claim 1 further comprising providing a protective barrier layer atop the wafer to a selected thickness prior to providing the polyimide layer atop the wafer.

10. The method of forming a buried bit line array of memory cells of claim 9 wherein the selected thickness of the protective barrier layer is from about 100 Angstroms to about 1000 Angstroms, and the protective barrier layer is comprised of an oxide material.

11. The method of forming a buried bit line array of memory cells of claim 1 further comprising:
   providing a protective barrier layer atop the wafer to a selected thickness prior to providing the polyimide layer atop the wafer; and
   depositing a layer of nitride to a selected thickness atop the polyimide layer, and patterning and etching the nitride and polyimide layers to define the pattern of buried bit line grooves.

12. The method of forming a buried bit line array of memory cells of claim 1 further comprising secondary etching the patterned and etched polyimide layer to widen the bit line grooves prior to providing the layer of insulating material atop the wafer to within the bit line grooves.

13. The method of forming a buried bit line array of memory cells of claim 1 wherein the step of providing an array of capacitors occurs subsequently to bit line groove formation and comprises:
   second patterning and etching the layer of polyimide to define buried contact openings to the second active regions;
   providing a layer of conductively doped node polysilicon to a selected thickness atop the wafer over the second patterned first layer of polyimide and within the buried contacts;
   etching the node polysilicon to define isolated cell storage nodes which contact the first active regions, the etching of the node polysilicon being conducted without any prior patterning or masking of the node polysilicon layer;
   providing a capacitor cell dielectric layer atop the individual storage nodes;
   providing a capacitor cell polysilicon layer atop the capacitor cell dielectric layer to define an array of memory cell capacitors; and
   providing an insulating layer atop the cell polysilicon layer.

14. A method of forming a buried bit line array of memory cells comprising:
   providing an array of substantially electrically isolated conductive word lines atop a semiconductor wafer, the conductive portions of adjacent word lines being separated from one another by a selected separation distance;
   providing active areas adjacent to the word lines to define an array of memory cell FETs, the active areas being defined by a first active region for electrical connection with a memory cell capacitor and a second active region for electrical connection with a bit line;
   providing a layer of a first material atop the wafer to a selected thickness, the first material being selectively etchable relative to oxide and polysilicon;
   patterning and etching the layer of first material to define a pattern of buried bit line grooves for formation of buried bit lines therewithin, the bit line grooves having a first selected width;
   providing a layer of insulating material to a selected thickness atop the wafer over the patterned and etched layer of first material, the selected thickness being less than half the first selected width, the layer of insulating material narrowing the bit line grooves to a smaller second width, the smaller second width bit line grooves having a base;
   applying, exposing and stripping photoresist to define a first pattern of bit line second active region contacts which overlap with bit line grooves;
   etching the insulating material from the bases of the second width bit line grooves to upwardly expose second active regions and thereby define a second pattern of bit line second active region contacts within the first pattern;
   providing a layer of conductively doped polysilicon atop the wafer to a selected thickness sufficient to plug the bases of the second width bit line grooves and electrically engage second active regions therewithin to at least partially form bit lines;
   providing a conductive material having higher conductivity than the conductively doped polysilicon within the second width bit line grooves atop the polysilicon within the second width bit line grooves;
   providing an insulating material above the conductive material; and
   providing an array of capacitors above the bit lines, the capacitors electrically engaging the first active regions.

15. The method of forming a buried bit line array of memory cells of claim 14 wherein the step of providing the insulating material over the patterned and etched layer of first material is conducted by depositing an oxide, the layer of first material filling between adjacent word lines over the first active regions during such deposition and thereby preventing word line spacer build up during such deposition.

16. The method of forming a buried bit line array of memory cells of claim 14 further comprising processing the wafer using a selected minimum photo feature width, the word line separation distance being equal to the minimum photo feature width.

17. The method of forming a buried bit line array of memory cells of claim 14 further comprising processing the wafer using a selected minimum photo feature width, the word line separation distance being equal to the minimum photo feature width; and wherein,
   the step of providing the insulating material over the patterned and etched layer of first material is conducted by depositing an oxide, the layer of first material filling between adjacent word lines over the first active regions during such deposition and thereby preventing word line spacer build up during such deposition.

18. The method of forming a buried bit line array of memory cells of claim 14 wherein the selected thickness of the layer of first material is from about 3,000 Angstroms to about 12,000 Angstroms.

19. The method of forming a buried bit line array of memory cells of claim 14 wherein the first pattern of bit line contacts is larger than the second pattern of bit line contacts, the etching of the insulating material to expose the second active regions and define the second pattern being conducted without additional photomasking.

20. The method of forming a buried bit line array of memory cells of claim 14 further comprising secondary etching the patterned and etched layer of first material to widen the bit line grooves prior to providing the layer of insulating material atop the wafer to within the bit line grooves.

21. A method of forming a buried bit line array of memory cells comprising:
   providing an array of substantially electrically isolated conductive word lines atop a semiconductor wafer, the conductive portions of adjacent word lines being separated from one another by a selected separation distance;
   providing active areas adjacent to the word lines to define an array of memory cell FETs, the active areas being defined by a first active region for electrical connection with a memory cell capacitor and a second active region for electrical connection with a bit line;
   providing a layer of first material atop the wafer to a selected thickness;
   patterning and etching the layer of first material to define a pattern of buried bit line grooves for formation of buried bit lines therewithin;
   providing bit line contact openings to second active regions within the bit line grooves;
   providing a layer of conductively doped polysilicon atop the wafer to a selected thickness sufficient to plug the bases of the bit line grooves and electrically engage second active regions therewithin to at least partially form bit lines;
   providing a conductive material having higher conductivity than the conductively doped polysilicon within the bit line grooves atop the polysilicon within the bit line grooves;
   providing an insulating material above the conductive material; and
   providing an array of capacitors above the bit lines, the capacitors electrically engaging the first active regions.

22. The method of forming a buried bit line array of memory cells of claim 21 wherein the selected thickness of the layer of first material is from about 3,000 Angstroms to about 12,000 Angstroms.

23. The method of forming a buried bit line array of memory cells of claim 22 wherein the selected thickness of the layer of first material is about 5,000 Angstroms.

24. A method of forming a buried bit line array of memory cells comprising:
   providing an array of substantially electrically isolated conductive word lines atop a semiconductor wafer, the conductive portions of adjacent word lines being separated from one another by a selected separation distance;
   providing active areas adjacent to the word lines to define an array of memory cell FETs, the active areas being defined by a first active region for electrical connection with a memory cell capacitor and a second active region for electrical connection with a bit line;
   providing a layer of first material atop the wafer to a selected thickness;
   patterning and etching the layer of first material to define a pattern of buried bit line grooves for formation of buried bit lines therewithin, the bit line grooves having a first selected width;
   providing a layer of insulating material to a selected thickness atop the wafer over the patterned and etched layer of first material, the selected thickness of insulating material being less than half the first selected width, the layer of insulating material narrowing the bit line grooves to a smaller second width, the smaller second width bit line grooves having a base;
   providing bit line contact openings to second active regions within and at the bases of the second width bit line grooves;
   providing a layer of conductively doped polysilicon atop the wafer to a selected thickness sufficient to plug the bases of the bit line grooves and electrically engage second active regions therewithin to at least partially form bit lines;
   providing a conductive material having higher conductivity than the conductively doped polysilicon within the bit line grooves atop the polysilicon within the bit line grooves;
   providing an insulating material above the conductive material; and
   providing an array of capacitors above the bit lines, the capacitors electrically engaging the first active regions.

25. The method of forming a buried bit line array of memory cells of claim 24 wherein the selected thickness of the layer of first material is from about 3,000 Angstroms to about 12,000 Angstroms.

26. The method of forming a buried bit line array of memory cells of claim 25 wherein the selected thickness of the layer of first material is about 5,000 Angstroms.

27. The method of forming a buried bit line array of memory cells of claim 24 wherein the insulating material provided over the patterned and etched layer of first material comprises $SiO_2$.

28. The method of forming a buried bit line array of memory cells of claim 24 wherein the selected thickness of the insulating material provided over the patterned and etched layer of first material is from about 1,000 Angstroms to about 3,000 Angstroms.

29. The method of forming a buried bit line array of memory cells of claim 24 wherein the selected thickness of the insulating material provided over the patterned and etched layer of first material is from about 1,000 Angstroms to about 3,000 Angstroms, and such insulating material comprises $SiO_2$.

30. The method of forming a buried bit line array of memory cells of claim 1 wherein the conductively doped polysilicon has varying thicknesses across the wafer.

31. The method of forming a buried bit line array of memory cells of claim 1 wherein the step of providing the layer of conductively doped polysilicon comprises:
   providing a layer of conductively doped polysilicon atop the wafer to (1) engage second active regions, (2) overlie the word lines, and (3) fill gaps between word lines such that the surface of the conductively doped polysilicon is elevationally above the word lines a height difference of about 1000 Angstroms, the conductively doped polysilicon having varying thicknesses across the wafer.

32. The method of forming a buried bit line array of memory cells of claim 14 wherein the conductively doped polysilicon has varying thicknesses across the wafer.

33. The method of forming a buried bit line array of memory cells of claim 14 wherein the step of providing the layer of conductively doped polysilicon comprises:
  providing a layer of conductively doped polysilicon atop the wafer to (1) engage second active regions, (2) overlie the word lines, and (3) fill gaps between word lines such that the surface of the conductively doped polysilicon is elevationally above the word lines a selected height difference.

34. The method of forming a buried bit line array of memory cells of claim 33 wherein the selected height difference is about 1000 Angstroms.

35. The method of forming a buried bit line array of memory cells of claim 14 wherein the step of providing the layer of conductively doped polysilicon comprises:
  providing a layer of conductively doped polysilicon atop the wafer to (1) engage second active regions, (2) overlie the word lines, and (3) fill gaps between word lines, whereby the surface of the conductively doped polysilicon is elevationally above the word lines, the polysilicon having varying thicknesses across the wafer;
  etching the conductively doped polysilicon such that a resulting surface thereof is elevationally above the word lines a selected height difference.

36. The method of forming a buried bit line array of memory cells of claim 35 wherein the selected height difference is about 1000 Angstroms.

37. The method of forming a buried bit line array of memory cells of claim 21 wherein the conductively doped polysilicon has varying thicknesses across the wafer.

38. The method of forming a buried bit line array of memory cells of claim 21 wherein the step of providing the layer of conductively doped polysilicon comprises:
  providing a layer of conductively doped polysilicon atop the wafer to (1) engage second active regions, (2) overlie the word lines, and (3) fill gaps between word lines such that the surface of the conductively doped polysilicon is elevationally above the word lines a height difference of about 1000 Angstroms, the conductively doped polysilicon having varying thicknesses across the wafer.

39. The method of forming a buried bit line array of memory cells of claim 24 wherein the conductively doped polysilicon has varying thicknesses across the wafer.

40. The method of forming a buried bit line array of memory cells of claim 24 wherein the step of providing the layer of conductively doped polysilicon comprises:
  providing a layer of conductively doped polysilicon atop the wafer to (1) engage second active regions, (2) overlie the word lines, and (3) fill gaps between word lines such that the surface of the conductively doped polysilicon is elevationally above the word lines a height difference of about 1000 Angstroms, the conductively doped polysilicon having varying thicknesses across the wafer.

* * * * *